United States Patent [19]

Nonaka

[11] 3,966,512

[45] June 29, 1976

[54] METHOD OF MANUFACTURING TARGETS OF PICKUP TUBES

[75] Inventor: Yasuhiko Nonaka, Mobara, Japan

[73] Assignee: Hitachi, Ltd., Tokyo, Japan

[22] Filed: Sept. 5, 1974

[21] Appl. No.: 503,261

[30] Foreign Application Priority Data

Sept. 10, 1973 Japan .............................. 48-101162

[52] U.S. Cl. ................................ 148/174; 148/175; 313/385; 313/386; 357/16; 357/30; 357/11; 427/76; 427/83; 427/87; 427/89;

[51] Int. Cl.$^{2}$ .................. H01L 21/06; H01L 21/203 H01L/27/14

[58] Field of Search .............. 148/174, 175; 357/16, 357/30, 11; 313/65, 94, 385, 386; 427/76, 83, 87, 89

[56] References Cited

UNITED STATES PATENTS

| | | | |
|---|---|---|---|
| 2,687,484 | 8/1954 | Weimer | 313/386 |
| 2,745,032 | 5/1956 | Forgue et al. | 313/385 |
| 3,290,568 | 12/1966 | Hershinger | 357/16 X |
| 3,303,344 | 2/1967 | Simms | 313/385 X |
| 3,350,595 | 10/1967 | Kramer | 313/386 X |
| 3,405,298 | 10/1968 | Dresner | 357/11 X |
| 3,596,151 | 7/1971 | Eldridge et al. | 357/30 |
| 3,615,413 | 10/1971 | Fisher et al. | 357/30 X |
| 3,755,002 | 8/1973 | Hirai et al. | 148/175 X |

*Primary Examiner*—L. Dewayne Rutledge
*Assistant Examiner*—W. G. Saba
*Attorney, Agent, or Firm*—Charles E. Pfund

[57] ABSTRACT

In a method of manufacturing the target of a pickup tube of the class wherein an N-type light transmitting conductive film is formed on a substrate, an N-type photoconductive film consisting of a group II–VI compound is formed on the N-type light transmitting conductive film by means of a vacuum deposition device comprising a boat for containing the compound and a hollow shielding member, and then a P-type amorphous photoconductive film consisting essentially of metal selenium is applied onto the N-type photoconductive film. The temperature of the substrate is maintained in a range of from 50°C to 250°C when the N-type photoconductive film is formed on the N-type light transmitting conductive film. The distance between the boat and the substrate is maintained in a range of from 8 to 13 cm. The boat and the substrate are contained in the hollow shielding member thereby maintaining homogeneous atmosphere of the group II–IV compound about the boat and the substrate, and the boat is preheated to a predetermined temperature.

10 Claims, 7 Drawing Figures

PRIOR ART
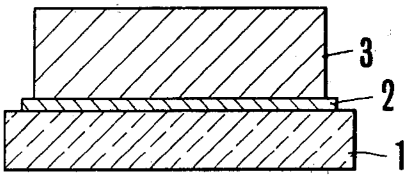
FIG.1
FIG.2
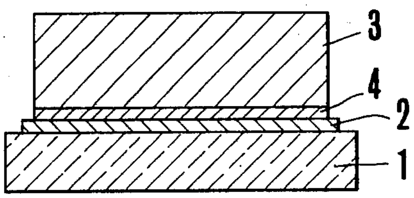
FIG.3
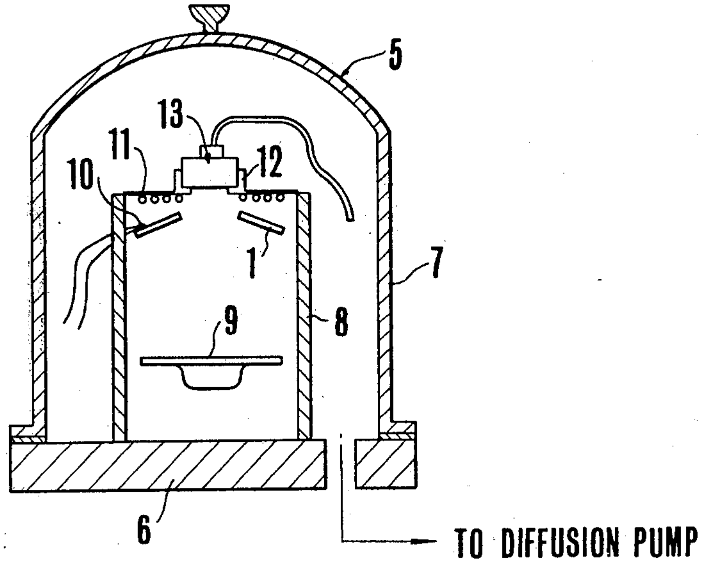

METHOD OF MANUFACTURING TARGETS OF PICKUP TUBES

BACKGROUND OF THE INVENTION

This invention relates to a method of manufacturing the target of an image pickup tube, and more particularly to a method of manufacturing a photoconductive film having a hetero-junction.

In the manufacturing of the target of a pickup tube, it has recently been proposed to deposit an N-type light transmitting conductive film consisting of indium oxide ($In_2O_3$) or tin oxide ($SnO_2$) on a light transmitting substrate of glass or quartz and then depositing a P-type amorphous photoconductive film consisting essentially of metallic selenium incorporated with tellurium (Te) and arsenic or the like for the purpose of preventing crystallization of the N-type conductive film in which the N-type light transmitting film and the P-type amorphous photoconductive film form a hetero-junction, thereby improving the spectral sensitivity characteristic, response speed characteristic, dark current characteristic, resolution characteristic, ease of production and other various characteristics, and such proposal has succeeded to some extent thus far.

However, when the target of a pickup tube constructed as described above is left standstill or operated at an environmental temperature above 40°C, due to the difference in the coefficient of thermal expansion of N-type and P-type films, stress is created along the interface between the two films. Thus when the pickup tube is left exposed to a high temperature or used in a high temperature atmosphere the dark current increases greatly with the result that the quality of the picture will be degraded greatly.

To overcome this difficulty I have proposed an improved target of a pickup tube wherein an N-type photoconductive film composed of compounds of the materials of groups II and VI of the periodic table such as cadmium selenide (CdSe), cadmium sulfide (CdS); zinc sulfide (ZnS) and zinc selenide (ZnSe), is interposed between the N-type light transmitting conductive film and the P-type amorphous photoconductive film.

According to this improved construction, the tendency of crystallization of P-type amorphous photoconductive film is more efficiently reduced by forming the N-type light transmitting film to have a desired thickness, and at the same time the problem of creating stress along the interface between the N-type light transmitting conductive film and the P-type amorphous photoconductive film when the ambient temperature rises beyond 40°C can also be solved. Further, the dark current and the number of twinkling defects are greatly decreased when compared with the prior art construction.

However, it was found that it is not always possible to obtain an excellent target by merely increasing the thickness of the N-type photoconductive film and that when the condition of manufacturing the film departs from the optional a satisfactory result can never be attained.

SUMMARY OF THE INVENTION

It is an object of this invention to provide an improved method of manufacturing the target of a pickup tube capable of greatly reducing the number of white spots and twinkling defects as well as the dark current.

According to this invention, there is provided a method of manufacturing the target of a pickup tube of the class wherein an N-type light transmitting conductive film is formed on a substrate, an N-type photoconductive film consisting of a group II and VI compound is formed on the N-type light transmitting conductive film by means of a vacuum deposition device comprising a boat for containing the compound and a hollow shielding member, and then a P-type amorphous photoconductive film consisting essentially of metallic selenium is applied onto the N-type photoconductive film, characterized in that the temperature of the substrate is maintained in a range of from 50°C to 250°C when the N-type photoconductive film is formed on the N-type light transmitting conductive film.

According to another aspect of this invention, the substance between the boat and the substrate is maintained in a range of from 8 to 13 cm and the boat and the substrate are contained in the hollow shielding member thereby maintaining homogeneous atmosphere of the group II and VI compound surrounding the boat and the substrate.

According to still another aspect of this invention, the boat is preheated at a predetermined temperature in the range of from 350°C to 500°C.

BRIEF DESCRIPTION OF THE DRAWINGS

Further objects and advantages of the invention can be more fully understood from the following detailed description taken in conjunction with the accompanying drawings in which, FIG. 1 is a sectional view of the prior art target of a pickup tube;

FIG. 2 is a sectional view showing the target manufactured in accordance with the method of this invention and used in a pickup tube;

FIG. 3 is a longitudinal sectional view of a vacuum deposition device utilized in the manufacture of the target of a pickup tube according to this invention;

DESCRIPTION OF THE PREFERRED EMBODIMENT

Figure 4:
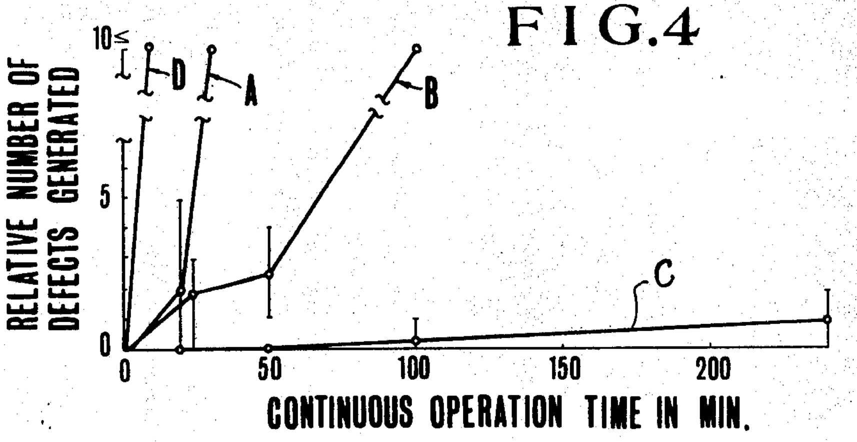
FIG. 4 is a graph showing the relationship between the temperature of the light transmitting substrate and the number of defects formed.

A prior art target of a pickup tube shown in FIG. 1 comprises a light transmitting substrate 1 made of glass or quartz, an N-type light transmitting conductive film 2 made up of indium oxide ($In_2O_3$) or tin oxide ($SnO_2$) and deposited on the substrate 1 and a P-type amorphous conductive film 3 deposited on the conductive film 2 and consisting essentially of metallic selenium (Se) incorporated with tellurium (Te) and arsenic (As) which is added for the purpose of preventing crystallization. The N-type light transmitting conductive film 2 and the P-type amorphous photoconductive film 3 form a photoconductive film of the hetero-junction type.

FIG. 2 shows the novel target of a pickup tube manufactured by the method of this invention in which portions corresponding to those shown in FIG. 1 are designated by the same reference numerals. In FIG. 2, reference numeral 4 represents an N-type photoconductive film formed by the deposition of groups II and VI compound on one surface of the N-type light transmitting conductive film 2, by using a vacuum deposition device shown in FIG. 3. The vacuum deposition device shown in FIG. 3 comprises a base 6 provided with an opening communicated with a diffusion pump, not shown, a jar or envelope 7 air tightly mounted on the base 6, a cylindrical shielding member 8 mounted on the base within the envelope 7, a metal boat 9 made of platinum, tantalum, molybdenum, etc., for containing the groups II and VI compound, said metal boat being disposed in the shielding member 8, a light transmitting substrate 1 spaced a predetermined distance from the metal boat 1, a thermocouple 10 positioned on the rear side (on which the N-type light transmitting film 2 is not provided) of the substrate for controlling the temperature thereof, a heater plate 11 provided with a nichrom wire, not shown, for heating the substrate, and a monitor 13 supported on the upper surface of the heater plate 11 by means of an insulator 12 for measuring the thickness of the film.

Some examples of manufacturing the target of a pickup tube by using the vacuum deposition device 5 shown in FIG. 3 will now be described.

EXAMPLE 1

In this example, a CdSe film having the thickness of about 240 A was firstly deposited on the substrate 1 by using the vacuum deposition device shown in FIG. 3 where the inside of the hollow shielding member and the substrate 1 were kept at temperatures of 25°C, 50°C, 100°C, 200°C, 300°C and 400°C for respective trials, and then the photoconductive film 4 was formed by the prior art method therafter being fabricated with the pickup tube. FIG. 4 is a graph showing the generation status of white spot defects and/or twinkling defects of pickup tubes using the targets with CdSe film formed by the method of this example 1 at the substrate temperatures 100°C, 200°C and 300°C respectively. In the figure, the bent line A shows the case where the substrate temperature was 300°C, the bent line B represents the case of 200°C, the bent line C represents the case of 100°C, and the line D represents the case where CdSe film was not formed.

Figure 5:
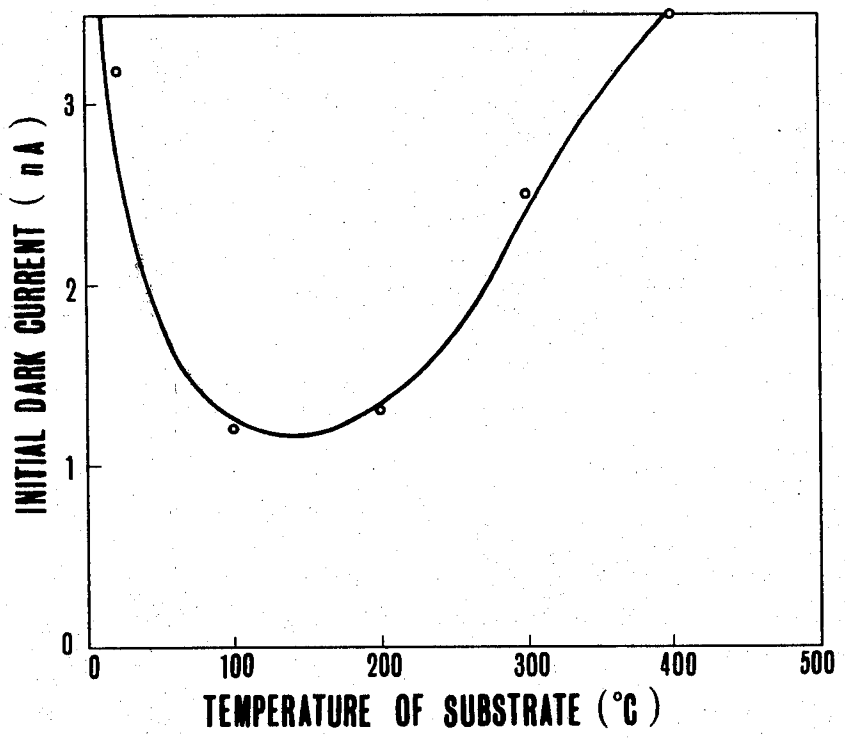
FIG. 5 is a graph showing the relationship between an initial dark current and the temperature of a substrate applied for CdSe film deposition.

FIG. 5 is a graph showing the relationship the substate temperatures at the deposition of CdSe film and the initial dark current of the pickup tube which is fabricated with targets achieved thereby. From FIGS. 4 and 5 it will be seen that at the deposition of CdSe film the lower the substrate temperature is, the more white spot defects and twinkling defects are decreased, but other defects such as dark current are increased when the substrate temperature is too low. Consequently, the substrate temperature at the deposition of CdSe film has a certain pertinent range, it is practically the range of from 50°C to 250°C, preferably from 80° and 200°C, and most desirably from 80°C to 120°C. In the last mentioned range i.e. 80°C to 120°C, the above-mentioned various defects were substantially eliminated from the practical standpoint of view.

The aforesaid tendency was observed when CdSe film was formed in the thickness of the range from 120 A to 260 A.

In FIG. 4 the relative number of defects generated is defined as the number of defects generated in the specific constant scanning area, for example 8.8 × 6.6 mm, after the test is started, where the number of defects at the initial state before the test is assumed zero.

Thus, according to this embodiment, when the thickness of the N-type photoconductive film 4 was set in a range of from 120 A to 260 A, it was possible to greatly decrease the number of white spot defects and twinkling defects.

While in the embodiment described above, the temperature of the substrate was maintained in a specific range for the purpose of eliminating previous defects, in the following example the metal boat was preheated for the purpose of preventing variation in the deposition speed.

EXAMPLE 2

In this example, when heating and evaporating CdSe contained in the metal boat 9 for the purpose of forming the N-type photoconductive film 4, the boat 9 was preheated at the temperature of the range from 350°C to 500°C for about 60 minutes for stabilizing the deposition speed of CdSe film, thereby improving the quality of CdSe film being obtained. Without such preheating, for example when a virgin metal boat 9 was used to form the N-type photoconductive film 4 on the substrate, the speed of deposition of the CdSe film formed on the N-type light transmitting conductive film 2 was decreased gradually as shown by curve E of FIG. 6. Namely the speed of the deposition is not stabilized and varies very much even after 10 minutes from the start of the deposition, so that the degree of crystallization of the CdSe film was varied for each deposition speed. Further as shown in FIG. 7, the peak value of the X-ray diffraction pattern representing the degree of crystallization was decreased with the length of the preheating treatment. The result of measurement of the percentage light transmission of the CdSe film showed that the absorption end was shifted forward short wavelength as the deposition speed was decreased. For this reason, where a virgin boat 9 was used without preheating or with a preheating up to 30 minutes, the sheet resistance of the CdSe was varied due to the variation in the degree of crystallization thus causing extreme instability of the dark current characteristic. As a result, the value of the initial dark current was increased to more than several nA. However, when the boat was preheated at the temperature of the range of from 350°C to 500°C for about 60 minutes the variation of the deposition speed was not noted as shown by curve F in FIG. 6 after the initial change thereof.

In this manner, according to this example, it was possible to prevent any appreciable change in the deposition speed by preheating the powder of CdSe contained in the metal boat in said temperature range for the period more than at least 30 minutes. This also eliminated the variations in the degree of crystallization, the percentage of light transmission and the sheet resistance, so that stable dark current was obtained. It was also possible to decrease the initial value of the dark current below 1nA.

Figure 6:
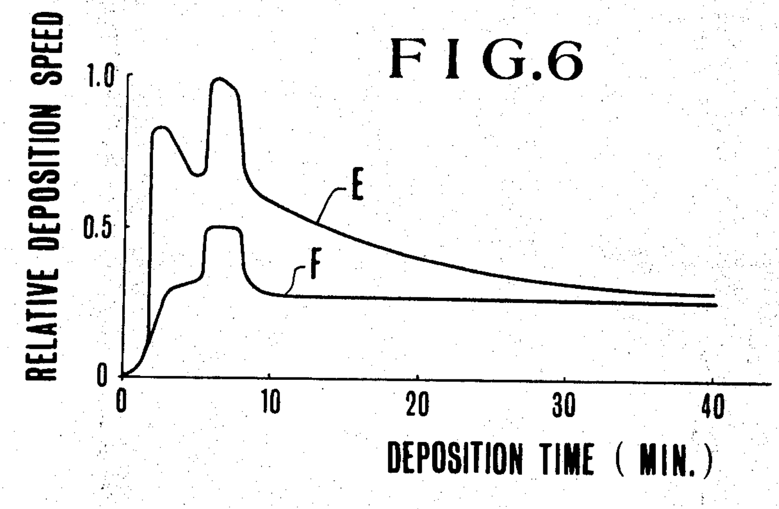
FIG. 6 is a graph showing the relationship between the deposition time of the groups II–VI compounds and the deposition speed.
Figure 7:
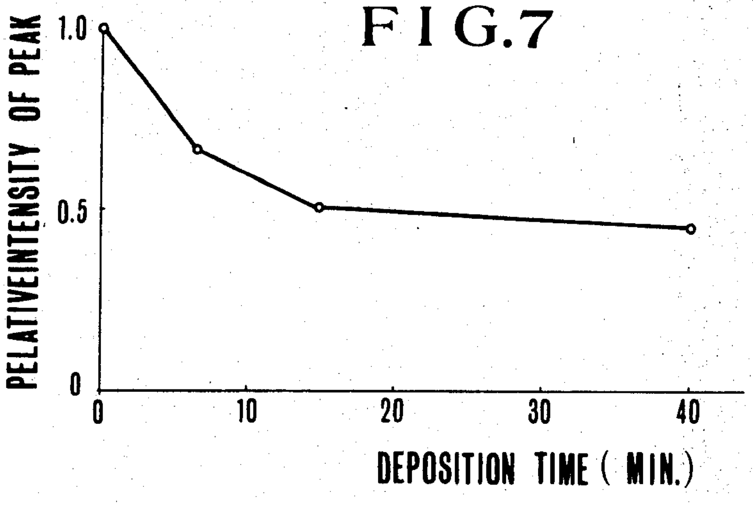
FIG. 7 is a graph showing the relationship between the deposition time of the group II and VI compounds and the peak value of the X-ray diffraction pattern.

In FIG. 6 a relative deposition speed is defined by representing the deposition speed where the boat temperature is maintained constantly at the temperature of 550°C with a quantitative relationship using an arbitrary scale.

The same advantage can also be provided by coating the metal boat 9 with a substance which is inactive to CdSe at elevated temperatures such as SiO and $SiO_2$ for the purpose of preventing the powder of CdSe from contacting the metal boat.

EXAMPLE 3

In this example, the distance between the metal boat 9 and the substrate 1 was maintained from 8 to 13 cm. The powder of CdSe contained in the boat 9 was evaporated to fill the interior of the cylindrical shielding member 8 with uniform atmosphere of CdSe. It was found that even when the diameter of the cylindrical shield member was varied over a wide range the characteristics of the target were not affected but that when the distance between the metal boat 9 and the substrate 1 was outside of the range of from 8 to 13cm, the dark current characteristic was degraded greatly not only during initial period but also throughout the entire operating period. For this reason, it is essential to select a suitable dimension of the shield member 9 and to maintain the distance between the metal boat and the substrate 1 in a range of from 8 to 13 cm.

Thus, according to this example, it was possible to greatly decrease the dark current by providing uniform atmosphere with the shielding member 8 and by maintaining the distance between the substrate and the metal boat within a prescribed range.

Above described examples may be carried out singly or in combination. For example, combination of examples 1 and 2, 2 and 3, and 1 and 3 may be used. Of course best result can be obtained when all examples 1 through 3 are used in combination.

Other compounds consisting of groups II and VI than CdSe can also be used with satisfactory results when the temperature of the substrate, the preheating condition of the metal boat and the distance between the metal boat and the substrate are selected as described hereinabove.

What is claimed is:

1. A method of manufacturing the target of a pickup tube comprising forming an N-type transmitting conductive film on a substrate, forming an N-type photoconductive film consisting of a group II–VI compound on said N-type light transmitting conductive film by means of a vacuum deposition device comprising a boat for containing said compound and a hollow shielding member, and then applying a P-type amorphous photoconductive film consisting essentially of metallic selenium onto said N-type photoconductive film, the temperature of said substrate being maintained in a range of from 50°C to 250°C when said N-type photoconductive film is formed on said N-type light transmitting conductive film, and the N-type photoconductive film being formed in a thickness of from about 120A to 260A.

2. The method according to claim 1 wherein said boat is made of a material which is inactive to said group II–VI compound at elevated temperatures.

3. The method according to claim 1 wherein said boat is coated with an oxide which is inert to said group II–VI compound at elevated temperatures.

4. The method according to claim 1 wherein the temperature of the substrate is maintained at from about 80°C to 120°C during formation of the N-type photoconductive film.

5. The method according to claim 1 wherein the distance between said boat and said substrate is maintained in a range of from 8 to 13 cm and said boat and said substrate are contained in said shielding member thereby maintaining a homogeneous atmosphere of said group II–VI compound surrounding said boat and said substrate.

6. The method according to claim 1 wherein said boat is preheated to a predetermined temperature prior to formation of the N-type photoconductive film.

7. The method according to claim 6 wherein said boat is preheated at a temperature of from 350°C to 500°C for about 60 minutes.

8. The method according to claim 6 wherein said boat is made of a material which is inactive to said group II–VI compound at an elevated temperature.

9. The method according to claim 6 wherein the distance between said boat and said substrate is maintained in a range of from 8 to 13 cm and said boat and said substrate is shielded by said shielding member thereby maintaining homogeneous atmosphere of said group II–VI compound about said boat and said substrate.

10. The method according to claim 6 wherein the boat is preheated to a temperature of about 350° to 500°C.

* * * * *